May 10, 1960 H. WELKER ET AL 2,936,373

CONTROLLABLE SEMICONDUCTOR DEVICES

Filed Oct. 15, 1954 2 Sheets-Sheet 1

United States Patent Office 2,936,373
Patented May 10, 1960

2,936,373

CONTROLLABLE SEMICONDUCTOR DEVICES

Heinrich Welker, Erich Weisshaar, and Hans Pfister, Erlangen, Germany, assignors to Siemens-Schuckertwerke Aktiengesellschaft, Berlin-Siemensstadt, Germany, a corporation of Germany Application October 15, 1954, Serial No. 462,516

Claims priority, application Germany October 20, 1953

16 Claims. (Cl. 250—83.3)

Our invention relates broadly to radiation responsive devices for detecting, measuring, controlling, regulating, translating, and other purposes requiring a change in an electric magnitude in dependence upon radiation, and more particularly to radiation receiving devices whose radiation-susceptible component comprises a crystalline semiconductor.

It is an object of the invention to provide a radiation responsive semiconductor device of much greater voltage, current or power capacity than heretofore attainable.

Another object of the invention is to devise a radiation-sensing semiconductor device whose output energy has a more favorable ratio to its dark conductance than could heretofore be realized with such devices.

Still another object of the invention is the provision of a radiation-sensing device better suitable than the known semiconductor devices for response to radiation wave lengths in the infrared range.

A further object is to produce a semiconductor rectifier whose barrier layer is less affected by increased temperature than is the case with the barrier-layer effect of p-n junctions in the known transistors, such as those of germanium.

It is also an object of the invention to devise a semiconductor device capable of selectively operating as a symmetrical or asymmetrical conductor, for instance in such a manner that it functions, under control by radiation, either as a rectifier or as an ohmic resistor.

To achieve these objects, and in accordance with a feature of our invention we subject an intrinsic semiconductor, to an electric field and to a magnetic field transversely directed to the electric field to thereby produce a magnetic barrier layer in the semiconductor with a controlling effect upon the electric resistance of the semiconductor. We simultaneously expose the semiconductor to radiation thus making the electric resistance of the semiconductor device dependent upon three controlling effects, namely the electric field, the magnetic field and the radiation, any one or two or all of the three effects being subject to variation to thereby produce the desired control, or response in resistive behavior, of the device.

The foregoing and other objects and features of our invention will be apparent from, or will be set forth in, the following description in conjunction with the drawings in which.

Figure 1:
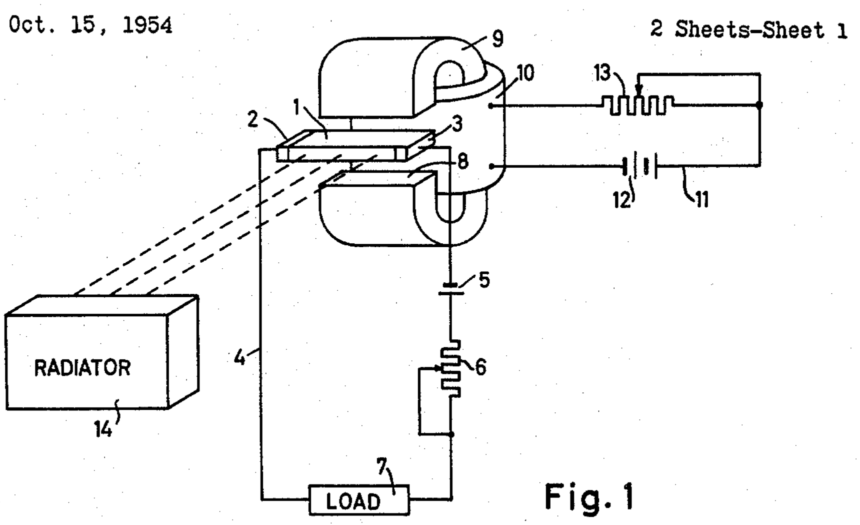
Fig. 1 shows schematically and in principle a semiconductor device according to the invention.

As shown in Fig. 1, the device comprises a crystalline semiconductor body 1 firmly joined with two metal terminals or electrodes 2, 3 with whose aid the semiconductor is connected in an electric circuit 4 to form a variable resistance component thereof. The circuit 4 includes a current source 5, a rheostat 6, and a load 7 to be controlled. The terminals 2, 3 need not form a Schottky barrier layer with the semiconductor substance but may serve only as bilaterally conductive current supply means so that the semiconductor body operates essentially as an ohmic resistor. The body may consist of germanium, indium antimonide or any other elementary or compound substance mentioned below, and is an intrinsic semiconductor as explained below. The semiconductor body 1 is located between the pole faces 8 of an electromagnet 9 whose coil 10 is excited in a circuit 11 from a current source 12 through a rheostat 13. Thus the semiconductor body 1 is subjected to an electric field caused by the voltage applied across the terminals 2, 3 and to the magnetic field between the pole faces of magnet 8, the magnetic field being directed perpendicularly to the electric field or having a perpendicular field component. The semiconductor body 1 is further exposed to radiation schematically shown to emanate from a source 14. The radiation may be electromagnetic, such as visible light, X-ray or infrared radiation, or it may be corpuscular, such as electron or neutron radiation as explained in a later place.

In a device of the type exemplified by the above-described embodiment, the resistance of the semiconductor body 1 depends upon three controlling effects, namely the electric field adjustable or variable by means of the rheostat 6, the magnetic field adjustable or variable by means of the rheostat 13, and the radiation which may also be variable. For instance, the device may normally operate with rheostats 6 and 13 set for optimum conditions so that the incident radiation is the only variable control effect to be sensed by the device. Then the device operates to control the current in load 7 by varying the semiconductor resistance in dependence upon the occurrence or intensity of radiation.

This functioning, of course, is generally comparable with that of conventional semiconductor photocells; but the device according to the invention is fundamentally distinct as regards various advantages including the possibility of operating the semiconductor circuit with much higher voltages and currents than previously applicable. These advantages are predicated upon the fact that the conjoint action of the electric and magnetic fields produces in the semiconductor a magnetic barrier effect as earlier disclosed in the copending application of H. Welker, Serial No. 297,788, filed July 8, 1952, for Controllable Electric Resistance Devices, assigned to the assignee of the present invention, issued as U.S. Patent 2,736,858, February 28, 1956; and the present invention is based upon the discovery that the magnetic barrier layer is sensitive to radiation and can be controlled thereby.

Before describing this radiation sensitivity more in detail, the phenomenon of the magnetic barrier layer will first be explained.

As mentioned, the resistively essential component of a device according to the invention consists of a semiconductor of the intrinsic type. An "intrinsic" semiconductor, as understood in this disclosure, is a semiconductor in which the electrons (excess electrons) and holes (defect electrons), in thermal equilibrium, have respective concentrations of the same order of magnitude. The terms "electron concentration" and "hole concentration" denote the number of electric charge carriers (electrons or holes) contained in one volumetric unit of the particular semiconductor location under consideration; and the statement that, in thermal equilibrium, these concentrations are of the same order of magnitude is intended to mean that the electron concentration is at most ten times the hole concentration, or vice versa.

Also understood as an "intrinsic semiconductor" for the purposes of the invention and within the scope of this disclosure is a semiconductor in which a greatly preponderant electron concentration (concentration of negative charge carriers) is accompanied by a small but still appreciable hole concentration (concentration of positive charge carriers), or vice versa. However, we have found it preferable to use intrinsic semiconductors whose electron and hole concentrations are of substantially equal magnitudes or are only little (i.e. up to about one decimal order) different from each other.

Figure 2:
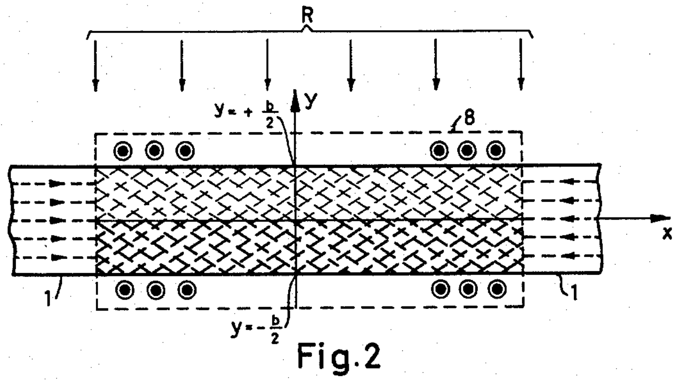
Fig. 2 is an explanatory and schematic illustration of a semiconductor member operating as a resistive circuit component and being subjected to electric and magnetic fields as occurring in a device according to Fig. 1.

When an intrinsic semiconductor body 1, for instance in a device as described with reference to Fig. 1, is traversed by electric current flowing in the direction shown in Fig. 2 and is also subjected to a magnetic field issuing from a magnet pole face 8 in a direction (Z) extending perpendicularly to the plane of illustration toward the observer as indicated by a few lines of force symbolically shown by encircled dots, then the current carriers, namely the electrons (excess electrons) as well as the holes (defect electrons), are diverted within the range of the magnetic field toward the same side of the semiconductor along slanted paths as schematically represented by broken lines. Hence one side of the semiconductor becomes depleted of electrons and holes while the other side becomes crowded. This is indicated in Fig. 2 by showing the slanted conductance lines heavier at the crowded side than at the depleted side of the semiconductor. This effect, as such, occurs also in a purely electron-conductive material without defect electrons. There, however, the crowding of the electrons at one side of the conductor is accompanied by the occurrence of surface charges which result in an electric counter field (Hall field) that soon puts an end to the crowding effect. This is not so with intrinsic semiconductors. Since electrons as well as holes are simultaneously brought to the same side of the semiconductor, the crowding does not produce a space charge and hence reaches a limit only when the gradients of the carrier density become so large that the magnetic forces are balanced by the counter forces of electron and hole diffusion.

On the crowded side of the semiconductor as well as on the depleted side, the electrons and holes are not in thermal equilibrium. Let $n_i$ denote the electron concentration (which is equal to the hole concentration) of an ideal intrinsic semiconductor, and let $n$ denote the actual electron concentration and $p$ the actual hole concentration, then on the crowded side $np>n_i^2$ and on the depleted side $np<n_i^2$, while at thermal equilibrium $np$ would have to be equal to $n_i^2$. Besides, for electric neutrality, $n$ must be approximately equal to $p$.

It follows that the depleted side, so to say, seeks to replenish its deficit in electron-hole pairs by thermal generation of electron-hole pairs, while the crowded side seeks to eliminate its excess in electron-hole pairs by recombination.

A quantitative investigation with certain metals which exhibit electron conductance as well as simultaneous hole conductance (as observed, for instance, with transition metals such as platinum and palladium) has shown that, with the slight values of electric field strength applicable in metals, the magnetic forces exertable upon electrons and holes are so minute that the resulting changes in electron and hole concentrations are immediately obviated by thermal generation and recombination. In such metals, therefore, the electron concentration, as well as the hole concentration, is spacially constant and is everywhere equal to its equilibrium value and virtually not controllable by extraneous electric and magnetic fields.

This is different with intrinsic semiconductors where the property of semiconductance (i.e. poor conductance in comparison with metals) makes it possible to apply electric fields many orders of magnitude stronger than those experimentally realizable with metals. For instance, a calculation for semiconductive, well crystallized germanium shows that an electron-hole pair, drifting perpendicularly to an exterior electric field of 10 volts/cm. (readily producible in germanium) and having a drift path perpendicular to a magnetic field directed at a right angle to the electric field and of 10,000 gauss field strength, may traverse a distance of 10 cm. before recombining.

Disregarding, at first, the generation of electron-hole pairs at the semiconductor surface on the depletion side, it will be recognized that the thickness of the depleted layer, defined by the condition that within it the electron-hole pair concentration is equal to $n_i$ or less, may readily be 1 cm. to 10 cm., neither of these values representing a lower or upper limit. This depletion layer is the "magnetic barrier layer" as this term is used in this specification, because it owes its existence to a magnetic field and has the electric neutrality peculiar to magnetic phenomena, in contrast to the Schottky barrier layer characterized by electric space charges. A conspicuous and advantageous distinction of the magnetic barrier layer over Schottky's barrier layer on the one hand, and Schockley's diffusion layer on the other hand, is its comparatively huge thickness, a dimension of decisive significance for practical applications especially at relatively high voltages or relatively strong currents. The term "high voltage" as just applied is used in comparison with the maximum inverse voltage attainable with selenium rectifiers. While selenium rectifiers permit an inverse voltage of only about 40 to 70 volts, nearly any voltage may be applied to the semiconductor device according to the invention, that is, very small voltages as well as any higher voltages such as 1000 volts or more. The term "strong current" as applied above refers to the maximum currents attainable with the known transistors and is to be understood as follows: In the new device the effective zone, that is, the depletion layer or magnetic barrier layer, is considerably larger in geometric dimensions than the effective zone (p–n junction) of the known transistors. It follows that in the new device the electrically effective layers and electrodes may readily be given considerably larger dimensions than for a transistor and that, therefore, the total currents flowing through the device can be made considerably higher. Thus, the new device permits currents of one ampere without special cooling, while a transistor has a current capacity of only 100 milliamps.

Figure 3:
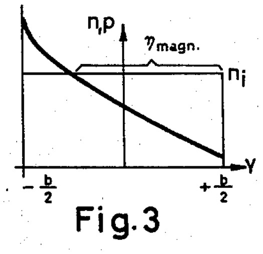
Figs. 3 to 8 are coordinate diagrams explanatory of the functioning of the semiconductor member.
Figure 4:
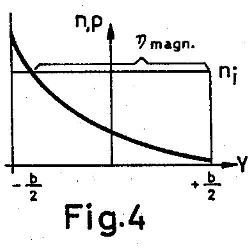

Designating in Fig. 2 the total thickness of the semiconductor in the Y-direction with $b$, the abscissa in each of the diagrams shown in Figs. 3 and 4 denotes the corresponding thickness, and the ordinate represents electron and hole concentrations. Fig. 3 shows the curve of the electron (or hole) concentration $n$ (or $p$) in the Y-direction perpendicular to the magnetic field direction Z. The value $\eta_{mag}$ denotes the thickness of the layer depleted of electrons and holes, i.e. of the magnetic barrier layer. This barrier-layer thickness increases with a decrease in volume recombination of the electron-hole pairs, and hence is the larger and the more closely the crystal lattice of the semiconductor approaches perfection. An appreciable recombination usually occurs at interfacial or grain boundaries. For that reason, and in accordance with another feature of the invention, the semiconductors consist preferably of single crystals to secure optimum results.

The characteristic of the electron and hole concentrations in the Y-direction also depends upon the properties of the semiconductor surfaces at $$y=+\frac{b}{2} \text{ and } y=-\frac{b}{2}$$

(Figs. 1 to 3). If the surface recombination differs from zero but is equal at the two opposite sides of the semiconductor, the carrier concentration for a slight volume recombination follows a course as typified by Fig. 4. In this case, the maximum density on the recombination side cannot exceed the value $\sqrt{2} \cdot n_1$, while at the generating side the value of $\bar{n}$ may become much smaller than $n_1$. Hence, the average value of the concentration $\bar{n}$ remains appreciably below $n_1$, and the formation of a magnetic barrier layer is accompanied by increased resistance of the semiconductor even in the primary direction of the electric current flow. A greatly excessive surface recombination, even in the absence of volume recombination, would obviate the formation of a magnetic barrier layer. This is because under thermal equilibrium conditions the recombination is equal to the thermal generation so that a surface with a large surface recombination at the depletion side would be capable of replenishing any number of electron-hole pairs and thus would maintain at $$y=+\frac{b}{2}$$

a marginal density practically equal to $n_1$. In devices according to our invention, therefore, the surface of the semiconductor is preferably subjected to a recombination-reducing surface treatment, for instance, to an anodic treatment in an electrolytic bath.

For making the average value of the electron-hole concentration in the Y-direction considerably smaller than the equilibrium value $n_1$, it is preferable to have slight surface recombination at the depletion side accompanied by a strong surface recombination at the crowded side. To this end, the depletion side of the semiconductor may be subjected to a recombination-reducing treatment, for instance, by electrolysis, while the crowded side is given a recombination-increasing surface treatment, for instance, by grinding and polishing.

Aside from the above mentioned factors that affect the magnetic barrier layer, the particular choice of the semi-conductive crystalline material, of course, is of greatest significance. Since the magnitude of the magnetic forces imposed upon the electrons and holes is proportional to their velocity and since this velocity for a given electric field is proportional to the mobility of the carrier, it is preferable for producing the magnetic barrier effect to use a semiconductor substance of high electron or hole mobility. (Mobility in cm.$^2$/volt sec. is defined as the velocity in cm. per sec. of the carrier in an electric field of one volt per cm.) For the purpose of the invention, therefore, semiconductors are preferable which consist of homopolar crystals of a mobility of at least 100 cm.$^2$/volt sec., for instance, the elements silicon, germanium, gray tin. Also applicable are such crystalline compounds as indium antimonate (InSb), gallium antimonate (GaSb), aluminum antimonate (AlSb), indium arsenate (InAs) and others as described in the copending application of H. Welker, Serial No. 275,785, filed March 10, 1952, Semiconductor Devices and Methods of Their Manufacture, assigned to the assignee of the present invention. That application issued as Patent No. 2,798,989, on July 9, 1957. The just-mentioned compounds are of the type $A_{III}B_V$, i.e. they are binary compounds of an element of the third group with an element of the fifth group of the periodic system. As defined in said Welker patent, the $A_{III}B_V$ group of semiconductors denotes semiconductor compounds of boron, aluminum, gallium, or indium, with nitrogen, phosphorus, arsenic, or antimony. With germanium, having an electron mobility of about 3,000 cm.$^2$/volt sec., the application of a magnetic field of 10,000 gauss results in a magnetic force, acting upon the electrons, whose ratio to the electric force acting upon the electrons is equal to $3{,}000\times 10{,}000\times 10^{-8}=0.3$. With InSb, having an electron mobility of 60,000 cm.$^2$/volt sec., this ratio is equal to 6.

The sensitivity of the magnetic barrier layer to radiation is due to the fact that under the effect of the radiation there occurs, directly or indirectly, a generation of electron-hole pairs which increases the electron-hole pair density in the magnetic barrier layer, thus partially or entirely obviating the magnetic barrier effects. This is electrically manifested by an increase in specific conductance within the barrier layer and indirectly by an increase in conductance of the semiconductor as a whole. The increase in specific conductance is comparable with the known interior photoelectric effect; but, as mentioned, devices according to invention have much larger spacial dimensions of the magnetic barrier layer, so that they can be operated with high voltages or strong currents. The fact that the magnetic barrier effect, due to the reduction in electron and hole concentration relative to the normal concentration $n_1$, occurs within a large volumetric range of the semiconductor crystal, has the further consequence that the dark conductance is considerably smaller than with the ordinary interior photoeffect.

If the applied radiation has a great penetrating capacity, in other words a large range of action, the generation of electron-hole pairs takes place throughout the entire thickness of the magetic barrier layer. Since, as mentioned, this thickness has a macroscopic order of magnitude, for instance 1 cm. to 10 cm. with germanium, devices according to the invention afford the detection of radiation of only slight absorption in solid bodies, such as hard X-rays, gamma radiation, corpuscular radiation of great velocity, or neutron radiation.

However, even if the applied radiation is strongly absorbed, i.e. has an only short range of penetration within the crystal, as is the case, for instance, with visible light, soft X-rays or corpuscular radiation of moderate velocity, the magnetic barrier layer effect is far superior to the ordinary interior photoeffect. In such cases, the orientation of a device according to the invention relative to the origin of radiation should be so chosen that the radiation impinges upon the one crystal surface which by virtue of its weak surface recombination is responsible for the existence of the magnetic barrier layer.

Figure 6:
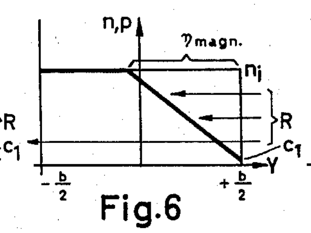
Figure 7:
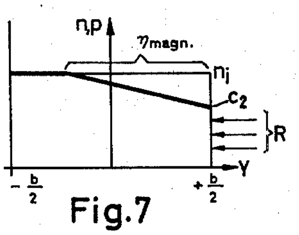

The above-mentioned changes occurring in the magnetic barrier layer as an effect of radiation will be further explained with reference to the schematic diagrams of Figs. 5 to 7. The three diagrams show different concentration curves $n$, $p$ of the electron-hole pairs within the same conductor crystal. The abscissa denotes the thickness of the crystalline body between the limits $$-\frac{b}{2} \text{ and } +\frac{b}{2}$$

in accordance with the corresponding thickness values given in Fig. 1. The ordinate in Figs. 4 to 6 denotes the electron-hole pair density. The curve $n$, $p$ therefore, represents the density or concentration at the various points across the thickness of the semiconductor.

Figure 5:
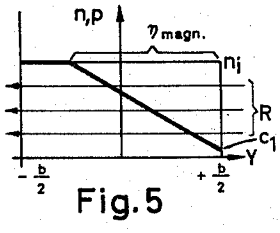

Fig. 5 relates to the hypothetic limit condition in which the incipient radiation, denoted by the arrows R, is not subjected to any absorption within the magnetic barrier layer. Fig. 6 relates to conditions under which the depth of penetration of the radiation is approximately equal to the thickness of the magnetic barrier layer. In this case, the marginal density $c_1$ of the electron-hole pairs at the surface $$y=+\frac{b}{2}$$

is the same as in the case represented by Fig. 4, while the thickness $\eta_{mag}$ of the magnetic barrier layer is reduced, thereby increasing the electric conductance value of the crystal as a whole. Fig. 7 exemplifies the above-mentioned case of slight penetration i.e. strong absorption of the radiation, that is, the radiation impinges upon the crystal surface of low surface recombination, i.e. the surface adjacent to the magnetic barrier layer, and the entire radiation is absorbed at this surface. This releases an additional number of electron-hole pairs per cm.$^2$ depending upon the intensity of radiation so that, while the thickness $\eta_{mag}$ of the magnetic barrier layer is the same as in Fig. 5, the marginal density increases from the value $c_1$ (Fig. 5) to the value $c_2$ (Fig. 7). This results in an increase in electric conductance of the semiconductor crystal as a whole.

Under the conditions of strong surface absorption described with reference to Fig. 6, the increased marginal density of the electron-hole pairs manifests itself throughout the entire thickness of the magnetic barrier layer as an increase in carrier-pair concentration. Hence, the magnetic barrier layer effect makes it possible, due to the electron-hole pairs generated in a surface layer, to subject to the control action a large depth of the semiconductor crystal. This results in a particularly large degree of amplification, that is, a large ratio of electric output energy to incident radiative energy.

Figure 8:
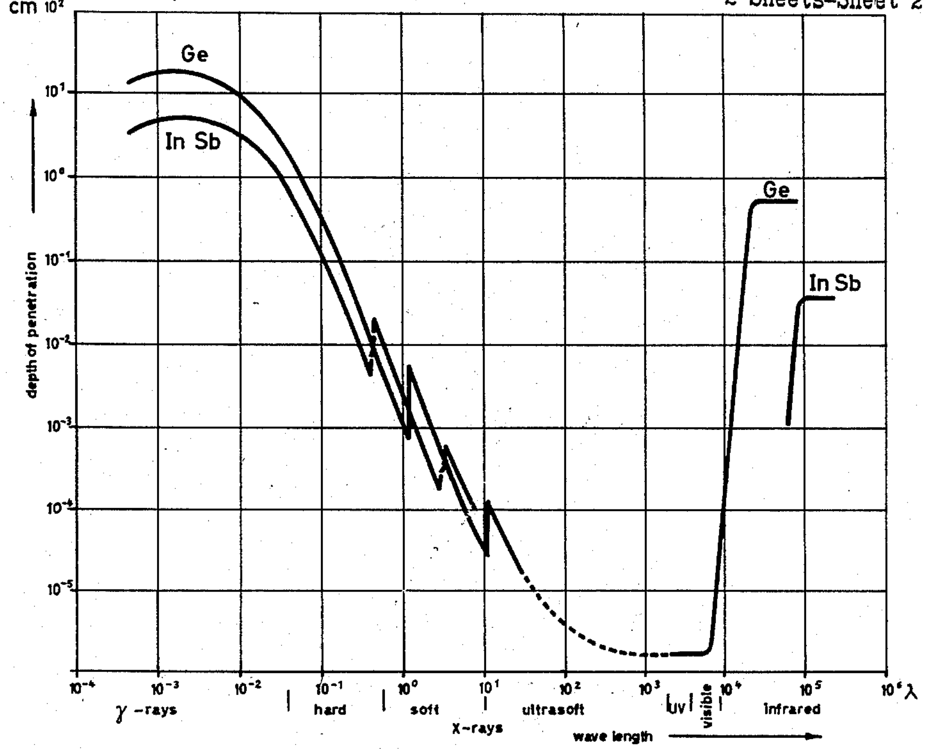

The basic absorption conditions for electromagnetic radiation are represented in Fig. 8 for a range of wave lengths extending over many powers of ten. The abscissa in Fig. 8 denotes wave length λ on a logarithmic scale. The full λ-range of the illustrated curves extends from about $5{:}10^{-4}$ A. to 5μ (1μ=0.001 *mn*). The ordinate in Fig. 8 represents depth of penetration also on a logarithmic scale (penetration=decline to $1/e$ of the intensity; $e$=base of the natural logarithm). The two curves denoted by Ge and InSb represent the absorption characteristics for germanium and indium antimonide, respectively. The substances germanium and antimonide were chosen merely as representative examples from the wide field of the various semiconductor substances applicable for the invention.

As apparent from Fig. 8 the depth of penetration within the range of visible radiation is slight and, accordingly, the absorption is very strong. For instance, in germanium the penetration is below $10^{-5}$ cm. Hence, as explained above, visible radiation can produce particularly strong electric effects due to the photoeffect of a magnetic barrier resulting in the generation of electron-hole pairs in a thin surface layer.

When proceeding from the range of visible radiation toward the left of the diagram, that is, toward shorter wave lengths, depth of penetration increases and absorption decreases. With gamma radiation, the depth of penetration reaches values in the order of magnitude of about 10 cm. Despite the large penetration of short-wave radiation, a sufficient absorption occurs within the magnetic barrier layer by virtue of the fact that this layer has the above-mentioned macroscopic dimensions in contrast to the barrier layers, for instance p-n transitions, heretofore applied for such purposes. The thickness of the magnetic barrier layer, which of course may amount to less than 1 cm. and may for instance have a thickness in the order of only 1 mm., can be adapted to the requirements of any particular application by a corresponding selection of the exterior electric field and the magnetic field. The absorption of short-wave radiation in the magnetic barrier layer has also the ultimate result of generating electron-hole pairs, thus producing the same effects as visible radiation.

The physical mechanism involved in operation with short-wave radiation can be summarily explained as follows. The ultimate result of the absorption of the radiation consists in the release of charge carriers. In the range of soft and medium X-rays, these charge carriers are essentially photoelectrons that are knocked out of the interior shells (for instance, the K or L shell) of the semiconductor atoms and become available in the conduction band. The accompanying replenishing of the inner shells results in producing holes (defect electrons) in the conduction band. In consequence, the radiation has the indirect effect of generating electron-hole pairs, thus causing the electric effects mentioned above.

With still shorter wave lengths, i.e. hard X-rays there commences the generation of conductance electrons by the Compton effect, and with still harder radiation (gamma radiation) the generation of electron-positron pairs. These phenomena also have the result of indirectly producing electron-hole pairs, thus causing the radiation to produce the above-described electric effects within the magnetic barrier layer.

From the foregoing, radiation of most varied wave lengths may be applied for controlling the magnetic barrier layer. The resulting electric change in the barrier layer is available for various purposes depending upon the particular circuit connection with which the semiconductor device is to be used. That is, the device may be used for detecting, analyzing or measuring radiation, for controlling or regulating an operation, for rectifying or otherwise translating, switching or limiting electric current or voltage. In cases where the magnetic barrier layer is utilized for producing a rectifier, as more fully described below, the invention affords controlling the rectifying operation by permitting and obviating the magnetic barrier effect by correspondingly controlled radiation. That is, the invention permits changing a magnetic barrier-layer rectifier into an ohmic resistor by subjecting the rectifying device to radiation.

When applying a device according to the invention for qualitatively ascertaining the presence of radiation, or for quantitatively measuring the intensity or energy of radiation, or for counting radiation quantums, the device offers the advantage of greatly increased accuracy and reliability.

It has also been found that the magnetic barrier effect in devices according to the invention is much less affected by changes in temperatures than the barrier effect of a p–n junction in the known transistors. For instance, when germanium is subjected to a temperature of 60° C., the magnetic barrier-layer effect is still well pronounced while the p-n barrier-layer effect is already much reduced in comparison with normal room temperature (20° C.). This is of considerable importance for many practical applications.

The above-presented explanation of the physical mechanism shows that it is advisable to select a particular semiconductor substance for adapting the device to radiation of a particular range of wave lengths.

For determining the characteristic radiation of a substance, the semiconductor to be used should consist of an element, or, if a compound, should include at least one component, whose X-ray absorption edge has a somewhat longer wave length than the radiation to be investigated. For example, if copper $K_a$-radiation (λ=1.54 A.) is to be detected, the semiconductor may consist of an $FeS_2$ crystal, the X-ray absorption edge of Fe being 1.74 A. In the infrared range, i.e. on the long-wave side of the visible range, the conditions as to depth of penetration are basically the same as in the visible range as long as the wave length remains on the same side of the absorption edge. The absorption-edge wave, length is different for different semiconductors. In germanium, for instance, the absorption edge has a wave length of about 2μ, while indium antimonide has an absorption edge at about 7μ. It is known that the detection of infrared radiation requires the use of semiconductors whose absorption edge lies so far within the infrared that the wave length to be detected is still within the range of strong absorption. Such semiconductors always have the disadvantage of great intrinsic conductance so that the dark conductance (dark current) of photoelectric cells made therefrom is very large. In the past, this has greatly limited the applicability of semiconductor bodies having an absorption-edge wave length deep within the infrared. However, since the magnetic barrier-layer effect greatly reduces the electron-hole pair concentration, a device according to the invention permits obtaining a small dark current even with an absorption edge deep within the infared range. As a result, the range of wave lengths for infrared receivers can be farther displaced into the infrared portion of the spectrum. Suitable as a semiconductor for such purposes, for instance, is indium antimonide having an absorption edge at about $7\mu$. Because of its large dark conductance, indium antimonide, generally, would not be applicable for infrared detection. However, in devices according to the invention, having a magnetic barrier layer prdouced in the semiconductor body and subjected to radiation, a semiconductor of indium antimonide can be made to operate as an especially favorable receiver for infrared radiation.

Instead of electromagnetic radiation, devices according to the invention may also operae with corpuscular radiation, for instance $\alpha$ or $\beta$ radiation (electron radiation). The change in the electric behavior of the semiconductor device due to slight corpuscular radiation energies occurs as a result of the ionization processes released thereby.

This applies also when the corpuscular radiation is neutron radiation. In contrast to the types of radiation mentioned previously, neutron rays do not affect the electron shells. However, any nuclear reaction released by the neutron radiation results in emission, for instance of gamma quantums or beta rays, which produces conductance electrons. Hence, ultimately, neutron radiation is also manifested by a change in conductance of the semiconductor body, so that the advantages afforded by the provision of a radiation-responsive magnetic barrier layer for response to corpuscular radiation are of the same kind as those obtained with electromagnetic radiation.

As mentioned above, a device according to the invention may be designed as a radiation-controllable rectifier. An embodiment of such a rectifier will presently be described with reference to Fig. 9.

Figure 9:
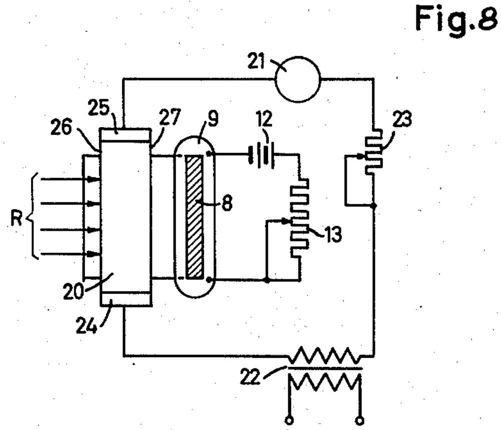
Figs. 9 and 10 exemplify two other circuit diagrams of semiconductor devices according to the invention.

The basic circuit of the control system shown in Fig. 9 is similar to that of Fig. 1 described above. A load, in this case a direct current motor 21, is connected in a circuit energized by alternating voltage from a transformer 22 through a rheostat 23 in series with a radiation-responsive semiconductor device according to the invention. The semiconductor body 20 has respective terminal contacts 24, 25 and is subjected to the magnetic field of an electromagnet 8 whose coil 9 is energized from a source 12 of constant direct voltage through a rheostat 13. The magnetic barrier-layer side 26 of the semiconductor crystal, that is the side depleted of the electron-hole pairs, is subjected to controllable radiation R. Depending upon the intensity of radiation, for instance visible illumination, the rectifying effect by the semiconductor device is more or less eliminated thereby controlling the speed of motor 21 accordingly.

To secure rectifying operation of the device, the semiconductor crystal 20 has a different surface texture at the two sides 26 and 27 that are parallel to the magnetic field and parallel to the flow direction of the current. To this end, these two surfaces are subjected to different surface treatments. For instance, the surface 26 is etched by anodic electrolysis and hence has a reduced surface recombination, and the surface 27 is ground and polished to a mirror-like finish and hence has an increased surface recombination. Due to the different surface properties, the semiconductor crystal 20 is electrically asymmetrical relative to its center plane parallel to the two mentioned crystal surfaces. If such a semiconductor is connected to an alternating-voltage supply as shown in Fig. 9, a magnetic barrier layer can develop only at its (etched) side 26 of reduced surface recombination but not at the opposite (polished) side 27. Hence, only the half waves of one polarity of the alternating voltage result in the formation of the magnetic barrier layer but not the voltage half waves of the other polarity. Consequently, the half waves of the first polarity are blocked by the barrier layer while the half waves of the second polarity are permitted to pass. The undesired inverse current may be kept small by a corresponding choice of the dimensions and physical properties of the semiconductor body. The rectifying effect, as explained, does not take place when sufficient radiation is effective to prevent the formation of the magnetic barrier layer.

Figure 10:
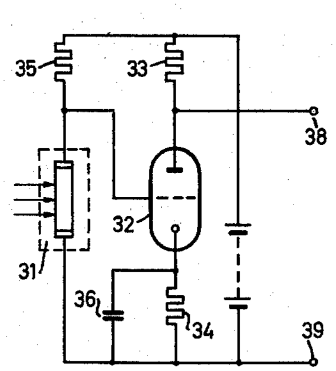

Fig. 10 represents a basic circuit diagram for applying a device according to the invention for the counting of radiation quantums. The radiation responsive semiconductor device, denoted as a whole by 31, is similar to that described with reference to Fig. 1 and operates substantially in the same manner. The device is connected in the grid circuit of an electronic tube 32 whose plate circuit includes an anode resistor 33 and a cathode resistor 34. The grid circuit is coupled with the anode circuit through a resistor 35. A capacitor 36 is connected parallel to the resistor 34. Whenever a quantum of radiation is received by the device 31, the tube 32 issues an amplified pulse which is available across the output terminals 38, 39.

While reference is made in the foregoing to the provision of an electromagnet for producing the magnetic field in the semiconductor, a permanent magnet is also applicable especially in cases where the magnetic field remains constant. For instance, in the embodiments shown in Figs. 9 and 10, the magnet (8 in Fig. 9) may be of the permanent type.

It will be obvious to those skilled in the art upon a study of this disclosure that our invention can be embodied in electric circuits of different or more intricate design than those specifically described and may be used for various purposes including others than those mentioned, without departing from the essence and essential features of the invention and within the scope of the claims annexed hereto.

We claim:

1. The method of controlling the conductance of a semiconductor, which comprises subjecting an intrinsic semiconductor simultaneously to an electric field and to a magnetic field transversely directed to the electric field to produce a magnetic barrier layer in the semiconductor in a region adjacent a surface of the semiconductor extending along the electric field direction, said layer when present forming a zone of increased electric resistance, said surface having a lesser surface recombination of electron-hole pairs than is required for replenishing displaced pairs, the lesser surface recombination facilitating formation of the magnetic barrier layer, and subjecting the semiconductor to radiation for controlling the magnetic barrier layer, said radiation being taken from the group consisting of electromagnetic radiation having a wave length not substantially greater than that of the infra red range, and corpuscular radiation.

2. The method of controlling the conductance of a semiconductor, which comprises subjecting an intrinsic semiconductor simultaneously to an electric field and to a magnetic field transversely directed to the electric field whereby a magnetic barrier layer is produced in the semiconductor adjacent to one side parallel to the direction of both said fields the formation of said magnetic barrier layer producing a zone of increased resistance, and subjecting said side of the semiconductor to incident radiation for controlling the magnetic barrier layer, said radiation being taken from the group consisting of electromagnetic radiation having a wave length not substantially greater than that of the infra red range, and corpuscular radiation.

3. The method of controlling the conductance of a semiconductor, which comprises subjecting an intrinsic semiconductor to an electric field and to a magnetic field transversely directed to the electric field to produce a magnetic barrier layer in the semiconductor in a region adjacent a surface of the semiconductor extending along the electric field direction, said layer when present forming a zone of increased electric resistance, said surface having a lesser surface recombination of electron-hole pairs than is required for replenishing displaced pairs, the lesser surface recombination facilitating formation of the magnetic barrier layer, and subjecting the semiconductor to electromagnetic radiation of shorter wave length than visible light to thereby control the magnetic barrier layer.

4. The method of sensing neutrons, which comprises subjecting an intrinsic semiconductor to an electric field and to a normally constant magnetic field transversely directed to the electric field to produce a magnetic barrier layer in the semiconductor, and subjecting the semiconductor to neutron radiation for controlling the magnetic barrier layer by secondary effects resulting from nuclear reaction due to said neutron radiation.

5. A controllable electric resistance device, comprising an intrinsic semiconductor, circuit means connected with said semiconductor to produce an electric field therein, magnet means having in said semiconductor a magnetic field in a direction transverse to said electric field whereby a magnetic barrier layer is produced in said semiconductor in a region adjacent a surface of the semiconductor extending along the electric field direction, said layer when present forming a zone of increased electric resistance, said surface having a lesser surface recombination of electron-hole pairs than is required for replenishing displaced pairs, the lesser surface recombination facilitating formation of the magnetic barrier layer, and means for applying radiation to said semiconductor, one of said three means being variable for thereby controlling said magnetic barrier layer, said radiation being taken from the group consisting of electromagnetic radiation having a wave length not substantially greater than that of the infra red range, and corpuscular radiation.

6. A controllable electric resistance device, comprising an intrinsic semiconductor, an electric circuit series connected with said semiconductor and having a voltage source for producing an electric field in said semiconductor, said circuit having a component to be controlled by conductance change of said semiconductor, magnetic field means having in said semiconductor a field direction transverse to said electric field to produce a magnetic barrier layer in said semiconductor, said layer when present forming a zone of increased resistance, a source of radiation, said semiconductor having its magnetic barrier-layer side directed toward said source, whereby said barrier layer is controlled by said radiation, said radiation being taken from the class consisting of corpuscular radiation, and electromagnetic radiation having a wave length not substantially greater than that of the infra red range.

7. A controllable electric resistance device, comprising an intrinsic semiconductor, electric circuit means connected with said semiconductor to produce an electric field therein, magnetic field means having in said semiconductor a magnetic field directed transverse to said electric field to produce a magnetic barrier layer in said semiconductor in a region adjacent a surface of the semiconductor extending along the electric field direction, said layer when present forming a zone of increased electric resistance, said surface having a lesser surface recombination of electron-hole pairs than is required for replenishing displaced pairs, the lesser surface recombination facilitating formation of the magnetic barrier layer, and a source of variable radiation, said semiconductor being disposed in the field of radiation of said source, and said radiation having a maximum intensity sufficient, when effective, to substantially obviate said magnetic barrier layer, said radiation being taken from the class consisting of corpuscular radiation, and electromagnetic radiation having a wave length not substantially greater than that of the infra red range.

8. A controllable electric resistance device, comprising an alternating-current circuit, an intrinsic semiconductor series connected in said circuit to be subjected to an electric field when traversed by current in said circuit, magnetic field means having in said semiconductor a magnetic field directed transverse to said electric field, said semiconductor consisting of a crystalline body having two opposite surfaces substantially parallel to the flow direction of said current and substantially parallel to said magnetic field direction, said two surfaces having low and high surface-recombination textures whereby said two fields produce adjacent to said surface of low surface recombination a magnetic barrier layer only during half waves of a given polarity of said current, and a controllable source of radiation having a radiation field to which said semiconductor is exposed and having, when effective, an intensity sufficient to obviate the formation of said magnetic barrier layer, whereby said device selectively operates as a rectifier and as a resistor, said radiation being taken from the class consisting of corpuscular radiation, and electromagnetic radiation having a wave length not substantially greater than that of the infra red range.

9. A controllable electric resistance device, comprising a crystalline semiconductor body of substantially intrinsic conductance having an elongated shape, magnetic field means impressing a magnetic field transversely of the body, circuit means connected to said body at the respective two longitudinal end regions thereof to pass current through the body, said body having two differently textured surface areas substantially opposite to each other and extending in the longitudinal direction of said body intermediate said two electrodes, electron-hole pairs being displaced by the magnetic field from one surface area to form a magnetic barrier layer thereat, said one surface area having an etched surface texture for reduced surface recombination of electron-hole pairs, and said other area having a polished surface texture for increased surface recombination, means for applying radiation to said semiconductor, to thereby control the magnetic barrier layer, said radiation being taken from the class consisting of corpuscular radiation, and electromagnetic waves having a wave length not substantially greater than that of the infra red range.

10. In a device according to claim 9, said semiconductor body consisting essentially of a crystalline semiconductor substance having a carrier mobility above 100 $cm.^2$/volt sec.

11. A controllable electric device comprising magnetic field means, a resistance body of crystalline intrinsic semiconductor material disposed in the magnetic field of said field means, said material being an intrinsic semiconductor crystal taken from the group consisting of silicon, germanium, and gray tin, electric field means having in said body an electric field of a direction intersecting the direction of said magnetic field, said body having a surface zone extending longitudinally of said electric field direction, whereby electron-hole pairs are displaced by said magnetic field away from said surface zone to form a magnetic barrier layer thereat, said zone having lesser surface recombination than required for replenishing the displaced pairs, so as to deplete said zone of electron-hole pairs when the device is in operation, means for applying radiation to said semiconductor to thereby control the magnetic barrier layer, said radiation being taken from the class consisting of corpuscular radiation, and electromagnetic waves having a wave length not substantially greater than that of the infra red range.

12. A controllable electric device comprising magnetic field means, a crystalline intrinsic semiconductor body disposed in the magnetic field of said field means and operating essentially as an ohmic resistor, electric circuit and load means connected to said body, said means including a current source for producing in said body an electric field of a direction intersecting the direction of said magnetic field, said body having longitudinally to said electric field direction a surface zone substantially at a location whence said magnetic field causes displacement of electron-hole pairs to form a magnetic barrier thereat, said surface zone having lesser surface recombination than required for replenishing the displaced pairs so as to be depleted of electron-hole pairs when the device is in operation, means for applying radiation to the body; the magnetic field means, the said electric field, and the radiation comprising agents determining the resistance of the body, at least one of these determining agents being variable, the load means being energized in response to the resistance variation of said body caused by the variation, said radiation being taken from the class consisting of corpuscular radiation, and electromagnetic waves having a wave length not substantially greater than that of the infra red range.

13. A controllable electric device comprising magnetic field means, a crystalline intrinsic semiconductor body disposed in the magnetic field of said field means and operating essentially as an ohmic resistor, electric circuit and load means connected to said body, said means including a current source for producing in said body an electric field of a direction intersecting the direction of said magnetic field, said body having longitudinally to said electric field direction a surface zone substantially at a location whence said magnetic field causes displacement of electron-hole pairs to form a magnetic barrier thereat, said surface zone having etched texture to provide lesser surface recombination than required for replenishing the displaced pairs so as to be depleted of electron-hole pairs when the device is in operation, the body having an opposite longitudinally directed surface having polished texture for high surface recombination, means for applying radiation to the body; the magnetic field means, the said electric field, and the radiation comprising agents determining the resistance of the body, at least one of these determining agents being variable, the load means being energized in response to the resistance variation of said body caused by the variation, said radiation being taken from the class consisting of corpuscular radiation, and electromagnetic waves having a wave length not substantially greater than that of the infra red range.

14. A controllable electric device comprising magnetic field means, a resistance body of crystalline intrinsic semiconductor material disposed in the magnetic field of said field means, said material being an intrinsic $A_{III}B_V$ binary semiconductor compound, electric field means having in said body an electric field of a direction intersecting the direction of said magnetic field, said body having a surface zone extending longitudinally of said electric field direction, whereby electron-hole pairs are displaced by said magnetic field away from said surface zone to form a magnetic barrier layer thereat, said zone having lesser surface recombination than required for replenishing the displaced pairs so as to be depleted of electron-hole pairs when the device is in operation, means for applying radiation to said semiconductor to thereby control the magnetic barrier layer, said radiation being taken from the class consisting of corpuscular radiation, and electromagnetic waves having a wave length not substantially greater than that of the infra red range, said $A_{III}B_V$ semiconductor being a single crystal and being formed of a compound of an element taken from the group consisting of boron, aluminum, gallium, and indium with an element of the group consisting of nitrogen, phosphorus, arsenic, and antimony, in equal atomic proportions, said semiconductor having a carrier mobility of at least 100 cm.$^2$/volt second.

15. The apparatus defined in claim 12, said body comprising an intrinsic $A_{III}B_V$ binary semiconductor, said $A_{III}B_V$ semiconductor being a single crystal and being formed of a compound of an element taken from the group consisting of boron, aluminum, gallium, and indium with an element of the group consisting of nitrogen, phosphorus, arsenic, and antimony, in equal atomic proportions, said semiconductor having a carrier mobility of at least 100 cm.$^2$/volt second.

16. The method of sensing electromagnetic radiation, which comprises subjecting an intrinsic semiconductor to an electric field and to a normally constant magnetic field transversely directed to the electric field to produce a magnetic barrier layer in the semiconductor in a region adjacent a surface of the semiconductor extending along the electric field direction, said layer when present forming a zone of increased electric resistance, said surface having a lesser surface recombination of electron-hole pairs than is required for replenishing displaced pairs, the lesser surface recombination facilitating formation of the magnetic barrier layer, subjecting the semiconductor to the electromagnetic radiation to be sensed, whereby the magnetic barrier layer is modified, and measuring the resulting conductance change of said semiconductor as indicative of said radiation, the electromagnetic radiation having a wave length not substantially greater than that of the infra red range.

References Cited in the file of this patent

UNITED STATES PATENTS

| | | |
|---|---|---|
| 2,604,596 | Ahearn | July 22, 1952 |
| 2,649,574 | Mason | Aug. 18, 1953 |
| 2,702,316 | Friend | Feb. 15, 1955 |

FOREIGN PATENTS

| | | |
|---|---|---|
| 687,130 | Great Britain | Feb. 4, 1953 |